(12) United States Patent
Dunklee et al.

(10) Patent No.: US 7,498,828 B2
(45) Date of Patent: *Mar. 3, 2009

(54) PROBE STATION WITH LOW INDUCTANCE PATH

(75) Inventors: John Dunklee, Tigard, OR (US); Clarence E. Cowan, Newberg, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/820,518

(22) Filed: Jun. 20, 2007

(65) Prior Publication Data
US 2007/0247178 A1 Oct. 25, 2007

Related U.S. Application Data

(63) Continuation of application No. 10/672,655, filed on Sep. 25, 2003, now Pat. No. 7,250,779.

(60) Provisional application No. 60/429,082, filed on Nov. 25, 2002.

(51) Int. Cl.
*G01R 31/02* (2006.01)
*G01R 31/28* (2006.01)

(52) U.S. Cl. ............... 324/754; 324/765; 324/158.1

(58) Field of Classification Search ......... 324/754–765, 324/158.1
See application file for complete search history.

(56) References Cited

U.S. PATENT DOCUMENTS

| 1,191,486 | A | 7/1916 | Tyler |
| 1,337,866 | A | 4/1920 | Whitacker |
| 2,142,625 | A | 1/1939 | Zoethout |
| 2,197,081 | A | 4/1940 | Piron |
| 2,264,685 | A | 12/1941 | Wells |
| 2,376,101 | A | 5/1945 | Tyzzer |
| 2,389,668 | A | 11/1945 | Johnson |
| 2,471,897 | A | 5/1949 | Rappi |
| 2,812,502 | A | 11/1957 | Doherty |
| 3,176,091 | A | 3/1965 | Hanson et al. |
| 3,185,927 | A | 5/1965 | Margulis et al. |
| 3,192,844 | A | 7/1965 | Szasz et al. |
| 3,193,712 | A | 7/1965 | Harris |
| 3,201,721 | A | 8/1965 | Voelcker |
| 3,230,299 | A | 1/1966 | Radziekowski |

(Continued)

FOREIGN PATENT DOCUMENTS

CN 1083975 3/1994

(Continued)

OTHER PUBLICATIONS

Mark S. Boguski and Martin W. McIntosh, "Biomedical informatics for proteomics," insight: review article, Nature 422, 233-237 (2003): doi:10.1038/nature01515.

(Continued)

*Primary Examiner*—Ha Tran T Nguyen
*Assistant Examiner*—Emily Y Chan
(74) *Attorney, Agent, or Firm*—Chernoff, Vilhauer, McClung & Stenzel

(57) ABSTRACT

A probe assembly suitable for high-current measurements of an electrical device.

10 Claims, 6 Drawing Sheets

U.S. PATENT DOCUMENTS

| | | |
|---|---|---|
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,742,571 A | 5/1988 | Letron |
| 4,744,041 A | 5/1988 | Strunk et al. |
| 4,746,857 A | 5/1988 | Sakai et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,766,384 A | 8/1988 | Kleinberg et al. |
| 4,771,234 A | 9/1988 | Cook et al. |
| 4,772,846 A | 9/1988 | Reeds |
| 4,777,434 A | 10/1988 | Miller et al. |

| | | | | | |
|---|---|---|---|---|---|
| 4,780,670 A | 10/1988 | Cherry | 5,091,732 A | 2/1992 | Mileski et al. |
| 4,783,625 A | 11/1988 | Harry et al. | 5,094,536 A | 3/1992 | MacDonald et al. |
| 4,784,213 A | 11/1988 | Eager et al. | 5,095,891 A | 3/1992 | Reitter |
| 4,786,867 A | 11/1988 | Yamatsu | 5,097,207 A | 3/1992 | Blanz |
| 4,787,752 A | 11/1988 | Fraser et al. | 5,101,149 A | 3/1992 | Adams et al. |
| 4,791,363 A | 12/1988 | Logan | 5,101,453 A | 3/1992 | Rumbaugh |
| 4,795,962 A | 1/1989 | Yanagawa et al. | 5,103,169 A | 4/1992 | Heaton et al. |
| 4,805,627 A | 2/1989 | Klingenbeck et al. | 5,105,148 A | 4/1992 | Lee |
| 4,810,981 A | 3/1989 | Herstein | 5,105,181 A | 4/1992 | Ross |
| 4,812,754 A | 3/1989 | Tracy et al. | 5,107,076 A | 4/1992 | Bullock et al. |
| 4,816,767 A | 3/1989 | Cannon et al. | 5,136,237 A | 8/1992 | Smith et al. |
| 4,818,169 A | 4/1989 | Schram et al. | 5,142,224 A | 8/1992 | Smith et al. |
| 4,827,211 A | 5/1989 | Strid et al. | 5,144,228 A | 9/1992 | Sorna et al. |
| 4,831,494 A | 5/1989 | Arnold et al. | 5,159,264 A | 10/1992 | Anderson |
| 4,838,802 A | 6/1989 | Soar | 5,159,267 A | 10/1992 | Anderson |
| 4,839,587 A | 6/1989 | Flatley et al. | 5,159,752 A | 11/1992 | Mahant-Shetti et al. |
| 4,845,426 A | 7/1989 | Nolan et al. | 5,160,883 A | 11/1992 | Blanz |
| 4,849,689 A | 7/1989 | Gleason et al. | 5,164,319 A | 11/1992 | Hafeman et al. |
| 4,853,613 A | 8/1989 | Sequeira et al. | 5,164,661 A | 11/1992 | Jones |
| 4,853,624 A | 8/1989 | Rabjohn | 5,166,606 A | 11/1992 | Blanz |
| 4,853,627 A | 8/1989 | Gleason et al. | 5,172,049 A | 12/1992 | Kiyokawa et al. |
| 4,856,426 A | 8/1989 | Wirz | 5,172,051 A | 12/1992 | Zamborelli |
| 4,856,904 A | 8/1989 | Akagawa | 5,187,443 A | 2/1993 | Bereskin |
| 4,858,160 A | 8/1989 | Strid et al. | 5,198,752 A | 3/1993 | Miyata et al. |
| 4,859,989 A | 8/1989 | McPherson | 5,198,753 A | 3/1993 | Hamburgen |
| 4,864,227 A | 9/1989 | Sato | 5,198,756 A | 3/1993 | Jenkins et al. |
| 4,871,883 A | 10/1989 | Guiol | 5,198,758 A | 3/1993 | Iknaian et al. |
| 4,871,965 A | 10/1989 | Elbert et al. | 5,202,558 A | 4/1993 | Barker |
| 4,884,026 A | 11/1989 | Hayakawa et al. | 5,209,088 A | 5/1993 | Vaks |
| 4,884,206 A | 11/1989 | Mate | 5,210,377 A | 5/1993 | Kennedy et al. |
| 4,888,550 A | 12/1989 | Reid | 5,210,485 A | 5/1993 | Kreiger et al. |
| 4,891,584 A | 1/1990 | Kamieniecki et al. | 5,214,243 A | 5/1993 | Johnson |
| 4,893,914 A | 1/1990 | Hancock et al. | 5,214,374 A | 5/1993 | St. Onge |
| 4,894,612 A | 1/1990 | Drake et al. | 5,218,185 A | 6/1993 | Gross |
| 4,896,109 A | 1/1990 | Rauscher | 5,220,277 A | 6/1993 | Reitinger |
| 4,899,998 A | 2/1990 | Teramachi | 5,221,905 A | 6/1993 | Bhangu et al. |
| 4,904,933 A | 2/1990 | Snyder et al. | 5,225,037 A | 7/1993 | Elder et al. |
| 4,904,935 A | 2/1990 | Calma et al. | 5,225,796 A | 7/1993 | Williams et al. |
| 4,906,920 A | 3/1990 | Huff et al. | 5,227,730 A | 7/1993 | King et al. |
| 4,916,398 A | 4/1990 | Rath | 5,232,789 A | 8/1993 | Platz et al. |
| 4,918,279 A | 4/1990 | Babel et al. | 5,233,197 A | 8/1993 | Bowman et al. |
| 4,918,374 A | 4/1990 | Stewart et al. | 5,233,291 A | 8/1993 | Kouno et al. |
| 4,918,383 A | 4/1990 | Huff et al. | 5,233,306 A | 8/1993 | Misra |
| 4,922,128 A | 5/1990 | Dhong et al. | 5,237,267 A | 8/1993 | Harwood et al. |
| 4,922,186 A | 5/1990 | Tsuchiya et al. | 5,245,292 A | 9/1993 | Milesky et al. |
| 4,923,407 A | 5/1990 | Rice et al. | 5,266,889 A | 11/1993 | Harwood et al. |
| 4,926,118 A | 5/1990 | O'Connor et al. | 5,267,088 A | 11/1993 | Nomura |
| 4,929,893 A | 5/1990 | Sato et al. | 5,270,664 A | 12/1993 | McMurtry et al. |
| 4,933,634 A | 6/1990 | Cuzin et al. | 5,274,336 A | 12/1993 | Crook et al. |
| 4,968,931 A | 11/1990 | Littlebury et al. | 5,278,494 A | 1/1994 | Obigane |
| 4,978,907 A | 12/1990 | Smith | 5,280,156 A | 1/1994 | Niori et al. |
| 4,978,914 A | 12/1990 | Akimoto et al. | 5,298,972 A | 3/1994 | Heffner |
| 4,982,153 A | 1/1991 | Collins et al. | 5,303,938 A | 4/1994 | Miller et al. |
| 4,994,737 A | 2/1991 | Carlton et al. | 5,304,924 A | 4/1994 | Yamano et al. |
| 5,001,423 A | 3/1991 | Abrami et al. | 5,315,237 A | 5/1994 | Iwakura et al. |
| 5,006,796 A | 4/1991 | Burton et al. | 5,321,352 A | 6/1994 | Takebuchi |
| 5,010,296 A | 4/1991 | Okada et al. | 5,321,453 A | 6/1994 | Mori et al. |
| 5,019,692 A | 5/1991 | Nbedi et al. | 5,325,052 A | 6/1994 | Yamashita |
| 5,030,907 A | 7/1991 | Yih et al. | 5,334,931 A | 8/1994 | Clarke et al. |
| 5,034,688 A | 7/1991 | Moulene et al. | 5,336,989 A | 8/1994 | Hofer |
| 5,041,782 A | 8/1991 | Marzan | 5,345,170 A | 9/1994 | Schwindt et al. |
| 5,045,781 A | 9/1991 | Gleason et al. | 5,357,211 A | 10/1994 | Bryson et al. |
| 5,061,823 A | 10/1991 | Carroll | 5,363,050 A | 11/1994 | Guo et al. |
| 5,065,089 A | 11/1991 | Rich | 5,369,368 A | 11/1994 | Kassen et al. |
| 5,065,092 A | 11/1991 | Sigler | 5,369,370 A | 11/1994 | Stratmann et al. |
| 5,066,357 A | 11/1991 | Smyth, Jr. et al. | 5,371,457 A | 12/1994 | Lipp |
| 5,070,297 A | 12/1991 | Kwon et al. | 5,373,231 A | 12/1994 | Boll et al. |
| 5,077,523 A | 12/1991 | Blanz | 5,374,938 A | 12/1994 | Hatazawa et al. |
| 5,082,627 A | 1/1992 | Stanbro | 5,376,790 A | 12/1994 | Linker et al. |
| 5,084,671 A | 1/1992 | Miyata et al. | 5,382,898 A | 1/1995 | Subramanian |
| 5,089,774 A | 2/1992 | Nakano | 5,397,855 A | 3/1995 | Ferlier |
| 5,091,691 A | 2/1992 | Kamieniecki et al. | 5,404,111 A | 4/1995 | Mori et al. |
| 5,091,692 A | 2/1992 | Ohno et al. | 5,408,188 A | 4/1995 | Katoh |

| Patent | Date | Inventor |
|---|---|---|
| 5,408,189 A | 4/1995 | Swart et al. |
| 5,410,259 A | 4/1995 | Fujihara et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,434,512 A | 7/1995 | Schwindt et al. |
| 5,448,172 A | 9/1995 | Dechene et al. |
| 5,451,884 A | 9/1995 | Sauerland |
| 5,457,398 A | 10/1995 | Schwindt et al. |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,554,236 A | 9/1996 | Singles et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A | 5/1997 | Spaziani et al. |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishaway et al. |
| 5,685,232 A | 11/1997 | Inoue |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhami |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A | 11/1998 | Yassine et al. |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,888,075 A | 3/1999 | Hasegawa et al. |
| 5,892,539 A | 4/1999 | Colvin |
| 5,900,737 A | 5/1999 | Graham et al. |
| 5,903,143 A | 5/1999 | Mochizuki et al. |
| 5,905,421 A | 5/1999 | Oldfield |
| 5,910,727 A | 6/1999 | Fujihara et al. |
| 5,916,689 A | 6/1999 | Collins et al. |
| 5,923,177 A | 7/1999 | Wardwell |
| 5,926,028 A | 7/1999 | Mochizuki |
| 5,942,907 A | 8/1999 | Chiang |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |

| | | |
|---|---|---|
| 5,952,842 A | 9/1999 | Fujimoto |
| 5,959,461 A | 9/1999 | Brown et al. |
| 5,960,411 A | 9/1999 | Hartman et al. |
| 5,963,027 A | 10/1999 | Peters |
| 5,963,364 A | 10/1999 | Leong et al. |
| 5,970,429 A | 10/1999 | Martin |
| 5,973,505 A | 10/1999 | Strid et al. |
| 5,974,662 A | 11/1999 | Eldridge et al. |
| 5,981,268 A | 11/1999 | Kovacs et al. |
| 5,982,166 A | 11/1999 | Mautz |
| 5,993,611 A | 11/1999 | Moroney, III et al. |
| 5,995,914 A | 11/1999 | Cabot |
| 5,996,102 A | 11/1999 | Haulin |
| 5,998,768 A | 12/1999 | Hunter et al. |
| 5,999,268 A | 12/1999 | Yonezawa et al. |
| 6,001,760 A | 12/1999 | Katsuda et al. |
| 6,002,236 A | 12/1999 | Trant et al. |
| 6,002,263 A | 12/1999 | Peters et al. |
| 6,002,426 A | 12/1999 | Back et al. |
| 6,013,586 A | 1/2000 | McGhee et al. |
| 6,019,612 A | 2/2000 | Hasegawa et al. |
| 6,023,209 A | 2/2000 | Faulkner et al. |
| 6,028,435 A | 2/2000 | Nikawa |
| 6,029,141 A | 2/2000 | Bezos et al. |
| 6,031,383 A * | 2/2000 | Streib et al. .................. 324/754 |
| 6,032,714 A | 3/2000 | Fenton |
| 6,034,533 A | 3/2000 | Tervo et al. |
| 6,037,785 A | 3/2000 | Higgins |
| 6,037,793 A | 3/2000 | Miyazawa et al. |
| 6,043,667 A | 3/2000 | Cadwallader et al. |
| 6,043,668 A | 3/2000 | Carney |
| 6,049,216 A | 4/2000 | Yang et al. |
| 6,051,422 A | 4/2000 | Kovacs et al. |
| 6,052,653 A | 4/2000 | Mazur et al. |
| 6,054,869 A | 4/2000 | Hutton et al. |
| 6,060,888 A | 5/2000 | Blackham et al. |
| 6,060,891 A | 5/2000 | Hembree et al. |
| 6,060,892 A | 5/2000 | Yamagata |
| 6,061,589 A | 5/2000 | Bridges et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,078,183 A | 6/2000 | Cole, Jr. |
| 6,091,236 A | 7/2000 | Piety et al. |
| 6,091,255 A | 7/2000 | Godfrey |
| 6,096,567 A | 8/2000 | Kaplan et al. |
| 6,100,815 A | 8/2000 | Pailthorp |
| 6,104,203 A | 8/2000 | Costello et al. |
| 6,104,206 A | 8/2000 | Verkuil |
| 6,111,419 A | 8/2000 | Lefever et al. |
| 6,114,865 A | 9/2000 | Lagowski et al. |
| 6,118,287 A | 9/2000 | Boll et al. |
| 6,118,894 A | 9/2000 | Schwartz et al. |
| 6,121,783 A | 9/2000 | Horner et al. |
| 6,124,723 A | 9/2000 | Costello |
| 6,124,725 A | 9/2000 | Sato |
| 6,127,831 A | 10/2000 | Khoury et al. |
| 6,130,544 A | 10/2000 | Strid et al. |
| 6,137,302 A | 10/2000 | Schwindt |
| 6,137,303 A | 10/2000 | Deckert et al. |
| 6,144,212 A | 11/2000 | Mizuta |
| 6,147,502 A | 11/2000 | Fryer et al. |
| 6,147,851 A | 11/2000 | Anderson |
| 6,160,407 A | 12/2000 | Nikawa |
| 6,166,553 A | 12/2000 | Sinsheimer |
| 6,169,410 B1 | 1/2001 | Grace et al. |
| 6,172,337 B1 | 1/2001 | Johnsgard et al. |
| 6,175,228 B1 | 1/2001 | Zamborelli et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,845 B1 | 2/2001 | Leisten et al. |
| 6,191,596 B1 | 2/2001 | Abiko |
| 6,194,720 B1 | 2/2001 | Li et al. |
| 6,194,907 B1 | 2/2001 | Kanao et al. |
| 6,198,299 B1 | 3/2001 | Hollman |
| 6,211,663 B1 | 4/2001 | Moulthrop et al. |
| 6,211,837 B1 | 4/2001 | Crouch et al. |
| 6,215,295 B1 | 4/2001 | Smith, III |
| 6,222,031 B1 | 4/2001 | Wakabayashi et al. |
| 6,222,970 B1 | 4/2001 | Wach et al. |
| 6,229,322 B1 | 5/2001 | Hembree |
| 6,229,327 B1 | 5/2001 | Boll et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,232,790 B1 | 5/2001 | Bryan et al. |
| 6,233,613 B1 | 5/2001 | Walker et al. |
| 6,236,223 B1 | 5/2001 | Brady et al. |
| 6,236,975 B1 | 5/2001 | Boe et al. |
| 6,236,977 B1 | 5/2001 | Verba et al. |
| 6,242,929 B1 | 6/2001 | Mizuta |
| 6,245,692 B1 | 6/2001 | Pearce et al. |
| 6,251,595 B1 | 6/2001 | Gordon et al. |
| 6,252,392 B1 | 6/2001 | Peters |
| 6,257,319 B1 | 7/2001 | Kainuma et al. |
| 6,257,564 B1 | 7/2001 | Avneri et al. |
| 6,259,261 B1 | 7/2001 | Engelking et al. |
| 6,265,950 B1 | 7/2001 | Schmidt et al. |
| 6,271,673 B1 | 8/2001 | Furuta et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,284,971 B1 | 9/2001 | Atalar et al. |
| 6,288,557 B1 | 9/2001 | Peters et al. |
| 6,292,760 B1 | 9/2001 | Burns |
| 6,300,775 B1 | 10/2001 | Peach et al. |
| 6,307,672 B1 | 10/2001 | DeNure |
| 6,310,483 B1 | 10/2001 | Taura et al. |
| 6,310,755 B1 | 10/2001 | Kholodenko et al. |
| 6,313,567 B1 | 11/2001 | Maltabes et al. |
| 6,313,649 B2 | 11/2001 | Harwood et al. |
| 6,320,372 B1 | 11/2001 | Keller |
| 6,320,396 B1 | 11/2001 | Nikawa |
| 6,327,034 B1 | 12/2001 | Hoover et al. |
| 6,335,625 B1 | 1/2002 | Bryant et al. |
| 6,335,628 B2 | 1/2002 | Schwindt et al. |
| 6,340,568 B2 | 1/2002 | Hefti |
| 6,340,895 B1 | 1/2002 | Uher et al. |
| 6,359,456 B1 | 3/2002 | Hembree et al. |
| 6,362,636 B1 | 3/2002 | Peters et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,380,751 B2 | 4/2002 | Harwood et al. |
| 6,384,614 B1 | 5/2002 | Hager et al. |
| 6,395,480 B1 | 5/2002 | Hefti |
| 6,396,296 B1 | 5/2002 | Tartar et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,560 B1 | 6/2002 | Walraven et al. |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,141 B1 | 7/2002 | Hollman et al. |
| 6,424,316 B1 | 7/2002 | Leisten et al. |
| 6,445,202 B1 | 9/2002 | Cowan et al. |
| 6,447,339 B1 | 9/2002 | Reed et al. |

| | | | | | | |
|---|---|---|---|---|---|---|
| 6,448,788 | B1 | 9/2002 | Meaney et al. | 6,777,964 B2 | 8/2004 | Navratil et al. |
| 6,459,739 | B1 | 10/2002 | Vitenberg | 6,778,140 B1 | 8/2004 | Yeh |
| 6,466,046 | B1 | 10/2002 | Maruyama et al. | 6,784,679 B2 | 8/2004 | Sweet et al. |
| 6,468,816 | B2 | 10/2002 | Hunter | 6,788,093 B2 | 9/2004 | Aitren et al. |
| 6,476,442 | B1 | 11/2002 | Williams et al. | 6,791,344 B2 | 9/2004 | Cook et al. |
| 6,480,013 | B1 | 11/2002 | Nayler et al. | 6,794,888 B2 | 9/2004 | Kawaguchi et al. |
| 6,481,939 | B1 | 11/2002 | Gillespie et al. | 6,794,950 B2 | 9/2004 | Du Toit et al. |
| 6,483,327 | B1 | 11/2002 | Bruce et al. | 6,798,226 B2 | 9/2004 | Altmann et al. |
| 6,483,336 | B1 | 11/2002 | Harris et al. | 6,801,047 B2 | 10/2004 | Harwood et al. |
| 6,486,687 | B2 | 11/2002 | Harwood et al. | 6,806,724 B2 | 10/2004 | Hayden et al. |
| 6,488,405 | B1 | 12/2002 | Eppes et al. | 6,806,836 B2 | 10/2004 | Ogawa et al. |
| 6,489,789 | B2 | 12/2002 | Peters et al. | 6,809,533 B1 | 10/2004 | Anlage et al. |
| 6,490,471 | B2 | 12/2002 | Svenson et al. | 6,812,718 B1 | 11/2004 | Chong et al. |
| 6,492,822 | B2 | 12/2002 | Schwindt et al. | 6,822,463 B1 | 11/2004 | Jacobs |
| 6,501,289 | B1 | 12/2002 | Takekoshi | 6,836,135 B2 | 12/2004 | Harris et al. |
| 6,512,482 | B1 | 1/2003 | Nelson et al. | 6,838,885 B2 | 1/2005 | Kamitani |
| 6,515,494 | B1 | 2/2003 | Low | 6,842,024 B2 | 1/2005 | Peters et al. |
| 6,528,993 | B1 | 3/2003 | Shin et al. | 6,843,024 B2 | 1/2005 | Nozaki et al. |
| 6,529,844 | B1 | 3/2003 | Kapetanic et al. | 6,847,219 B1 | 1/2005 | Lesher et al. |
| 6,548,311 | B1 | 4/2003 | Knoll | 6,856,129 B2 | 2/2005 | Thomas et al. |
| 6,549,022 | B1 | 4/2003 | Cole, Jr. et al. | 6,861,856 B2 | 3/2005 | Dunklee et al. |
| 6,549,026 | B1 | 4/2003 | Dibattista et al. | 6,864,694 B2 | 3/2005 | McTigue |
| 6,549,106 | B2 | 4/2003 | Martin | 6,873,167 B2 | 3/2005 | Goto et al. |
| 6,566,079 | B2 | 5/2003 | Hefti | 6,885,197 B2 | 4/2005 | Harris et al. |
| 6,573,702 | B2 | 6/2003 | Marcuse et al. | 6,900,646 B2 | 5/2005 | Kasukabe et al. |
| 6,578,264 | B1 | 6/2003 | Gleason et al. | 6,900,647 B2 | 5/2005 | Yoshida et al. |
| 6,580,283 | B1 | 6/2003 | Carbone et al. | 6,900,652 B2 | 5/2005 | Mazur |
| 6,582,979 | B2 | 6/2003 | Coccioli et al. | 6,900,653 B2 | 5/2005 | Yu et al. |
| 6,587,327 | B1 | 7/2003 | Devoe et al. | 6,902,941 B2 | 6/2005 | Sun |
| 6,603,322 | B1 | 8/2003 | Boll et al. | 6,903,563 B2 | 6/2005 | Yoshida et al. |
| 6,605,951 | B1 | 8/2003 | Cowan | 6,914,244 B2 | 7/2005 | Alani |
| 6,605,955 | B1 | 8/2003 | Costello et al. | 6,914,580 B2 | 7/2005 | Leisten |
| 6,608,494 | B1 | 8/2003 | Bruce et al. | 6,924,656 B2 | 8/2005 | Matsumoto |
| 6,608,496 | B1 | 8/2003 | Strid et al. | 6,927,079 B1 | 8/2005 | Fyfield |
| 6,611,417 | B2 | 8/2003 | Chen | 6,937,341 B1 | 8/2005 | Woollam et al. |
| 6,617,862 | B1 | 9/2003 | Bruce | 6,970,001 B2 | 11/2005 | Chheda et al. |
| 6,621,082 | B2 | 9/2003 | Morita et al. | 6,987,483 B2 | 1/2006 | Tran |
| 6,624,891 | B2 | 9/2003 | Marcus et al. | 7,001,785 B1 | 2/2006 | Chen |
| 6,627,461 | B2 | 9/2003 | Chapman et al. | 7,002,133 B2 | 2/2006 | Beausoleil et al. |
| 6,628,503 | B2 | 9/2003 | Sogard | 7,002,363 B2 | 2/2006 | Mathieu |
| 6,628,980 | B2 | 9/2003 | Atalar et al. | 7,002,364 B2 | 2/2006 | Kang et al. |
| 6,633,174 | B1 | 10/2003 | Satya et al. | 7,003,184 B2 | 2/2006 | Ronnekleiv et al. |
| 6,636,059 | B2 | 10/2003 | Harwood et al. | 7,005,842 B2 | 2/2006 | Fink et al. |
| 6,636,182 | B2 | 10/2003 | Mehltretter | 7,005,868 B2 | 2/2006 | McTigue |
| 6,639,415 | B2 | 10/2003 | Peters et al. | 7,005,879 B1 | 2/2006 | Robertazzi |
| 6,639,461 | B1 | 10/2003 | Tam et al. | 7,006,046 B2 | 2/2006 | Aisenbrey |
| 6,642,732 | B2 | 11/2003 | Cowan et al. | 7,007,380 B2 | 3/2006 | Das et al. |
| 6,643,597 | B1 | 11/2003 | Dunsmore | 7,009,188 B2 | 3/2006 | Wang |
| 6,650,135 | B1 | 11/2003 | Mautz et al. | 7,009,383 B2 | 3/2006 | Harwood et al. |
| 6,653,903 | B2 | 11/2003 | Leich et al. | 7,009,415 B2 | 3/2006 | Kobayashi et al. |
| 6,657,601 | B2 | 12/2003 | McLean | 7,011,531 B2 | 3/2006 | Egitto et al. |
| 6,686,753 | B1 | 2/2004 | Kitahata | 7,012,425 B2 | 3/2006 | Shoji |
| 6,701,265 | B2 | 3/2004 | Hill et al. | 7,012,441 B2 | 3/2006 | Chou et al. |
| 6,707,548 | B2 | 3/2004 | Kreimer et al. | 7,013,221 B1 | 3/2006 | Friend et al. |
| 6,710,798 | B1 | 3/2004 | Hershel et al. | 7,014,499 B2 | 3/2006 | Yoon |
| 6,717,426 | B2 | 4/2004 | Iwasaki | 7,015,455 B2 | 3/2006 | Mitsuoka et al. |
| 6,720,782 | B2 | 4/2004 | Schwindt et al. | 7,015,689 B2 | 3/2006 | Kasajima et al. |
| 6,724,205 | B1 | 4/2004 | Hayden et al. | 7,015,690 B2 | 3/2006 | Wang et al. |
| 6,724,928 | B1 | 4/2004 | Davis | 7,015,703 B2 | 3/2006 | Hopkins et al. |
| 6,727,716 | B1 | 4/2004 | Sharif | 7,015,707 B2 | 3/2006 | Cherian |
| 6,731,804 | B1 | 5/2004 | Carrieri et al. | 7,015,708 B2 | 3/2006 | Beckous et al. |
| 6,734,687 | B1 | 5/2004 | Ishitani et al. | 7,015,709 B2 | 3/2006 | Capps et al. |
| 6,737,920 | B2 | 5/2004 | Jen et al. | 7,015,710 B2 | 3/2006 | Yoshida et al. |
| 6,739,208 | B2 | 5/2004 | Hyakudomi | 7,015,711 B2 | 3/2006 | Rothaug et al. |
| 6,744,268 | B2 | 6/2004 | Hollman | 7,019,541 B2 | 3/2006 | Kittrell |
| 6,753,679 | B1 | 6/2004 | Kwong et al. | 7,019,544 B1 | 3/2006 | Jacobs et al. |
| 6,753,699 | B2 | 6/2004 | Stockstad | 7,019,701 B2 | 3/2006 | Ohno et al. |
| 6,756,751 | B2 | 6/2004 | Hunter | 7,020,360 B2 | 3/2006 | Satomura et al. |
| 6,768,328 | B2 | 7/2004 | Self et al. | 7,020,363 B2 | 3/2006 | Johannessen |
| 6,770,955 | B1 | 8/2004 | Coccioli et al. | 7,022,976 B1 | 4/2006 | Santana, Jr. et al. |
| 6,771,090 | B2 | 8/2004 | Harris et al. | 7,022,985 B2 | 4/2006 | Knebel et al. |
| 6,771,806 | B1 | 8/2004 | Satya et al. | 7,023,225 B2 | 4/2006 | Blackwood |
| 6,774,651 | B1 | 8/2004 | Hembree | 7,023,226 B2 | 4/2006 | Okumura et al. |

| Patent Number | Date | Inventor |
|---|---|---|
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |
| 7,187,188 B2 | 3/2007 | Andrews et al. |
| 7,188,037 B2 | 3/2007 | Hidehira |
| 7,221,172 B2 * | 5/2007 | Dunklee .................... 324/754 |
| 7,250,779 B2 * | 7/2007 | Dunklee et al. ............ 324/754 |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 | 6/2002 | Stone et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 * | 7/2003 | Navratil et al. .......... 324/158.1 |
| 2003/0155939 A1 | 8/2003 | Lutz et al. |
| 2003/0156270 A1 | 8/2003 | Hunter |
| 2003/0170898 A1 | 9/2003 | Gunderson et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2004/0267691 A1 | 12/2004 | Vasudeva |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Baliarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |

FOREIGN PATENT DOCUMENTS

| | | |
|---|---|---|
| DE | 31 14 466 | 3/1982 |
| DE | 31 25 552 | 11/1982 |
| DE | 36 37 549 | 5/1988 |
| DE | 41 09 908 | 10/1992 |
| DE | 43 16 111 | 11/1994 |
| DE | 195 41 334 | 9/1996 |
| DE | 196 16 212 | 10/1996 |
| DE | 195 22 774 | 1/1997 |
| DE | 196 18 717 | 1/1998 |
| DE | 693 22 206 | 4/1999 |
| DE | 100 00 324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 | 5/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |

| | | |
|---|---|---|
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |
| JP | 62-011243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209308 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christopher Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, Vol. MTT-35, No. 12, Dec. 1987, pp. 1424-1428.

Mohammed Nurul Afsar, James R. Birch, and R. N. Clarke, "The Measurment of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th European Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Eric Phizicky, Philippe I.H. Bastiaens, Heng Zhu, Michael Snyder, & Stanley Fields, "Protein anaylsis on a proteomic scale," Nature 422, insight: review article, Mar. 13, 2003.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1988, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Design Technique, "Microstrip Microwave Test Fixture," May 1986, 2 pages.

Photo: Micromanipulator Probe Station 1994.

Micromanipulator Sales and Services Inc., "Test Station Accessories," Copyright 1983, 1984, 1 page.

Keithley Instruments, Inc. "Low-Level Measurements for Effective Current, Low Voltage, and High Impedance Measurements," Revised Third Edition, Printed Jun. 1984.

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Design Technique International, "Adjustable Test Fixture," Copyright 1988.

Ronald F. Bauer & Paul Penfield, Jr., "De-Embedding and Unterminating,"IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R.Y. Koyama & M. G. Buehler, "Semiconductor Measuement Technology: A Wafer Chuck for Use Between—196 and 350° C., " U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

The Micromanipulator Company, Inc., "Model 8000 Test Station," 1986, 1 page.

The Micromanipulator Company, Inc. "Model 8000 Test Station," 1988, 1 page.

The Micromanipulator Company, Inc., "Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 page.

Hewlett Packard, "HP 4142B Modular DC source/Monitor Practical Applications—High Speed DC Characterization of Semiconductor Devices from Sub pA to 1A," Nov. 1987, pp. 1-4.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3,"*Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, 577C, May 13, 1998, 3 pages.

*Cascade Microtech, Inc.* vs. *Micromanipulator Company, Inc.*, Applebay Exhibit 585, May 13, 1998, 7 pages.

* cited by examiner

PROBE STATION WITH LOW INDUCTANCE PATH

CROSS-REFERENCE TO RELATED APPLICATIONS

This application is a continuation of U.S. patent application Ser. No. 10/672,655, filed Sep. 25, 2003, now U.S. Pat. No. 7,250,779; which application claims the benefit of U.S. Provisional App. No. 60/429,082, filed Nov. 25, 2002.

BACKGROUND OF THE INVENTION

The present invention relates to probe stations, commonly known as package or wafer probers, used manually, semi-automatically, or fully automatically to test electrical devices such as semiconductor wafers.

Existing probe stations are capable of performing both low-current and high frequency measurements in an electronically quiet environment. The environment may be provided by, for example, incorporating one or more guard and electromagnetic interference (EMI) shield structures within an environmental enclosure. Guard and EMI shield structures are well known and discussed extensively in technical literature. See, for example, an article by William Knauer entitled "Fixturing for Low Current/Low Voltage Parametric Testing" appearing in *Evaluation Engineering*, November, 1990, pages 150-153. Examples of existing probe stations that provide such guard and EMI shield structures can be found in commonly owned U.S. Pat. Nos. 5,434,512; and 5,266,889 which are hereby incorporated by reference.

Probe stations deliver a test signal to an electrical device, such as a semiconductor wafer, whose characteristics are to be measured. Test conditions are desirably controlled and substantially free of electromagnetic interference, though not necessarily, that may emanate from test instrumentation or other nearby electrical equipment, or that may result from spurious air currents or the like. To provide a controlled and substantially noise-free test environment, existing probe stations that incorporate guard structures will usually at least partially surround the test signal path with a guard signal that closely approximates the test signal, thus inhibiting electromagnetic current leakage from the test signal path to its immediately surrounding environment. Similarly, EMI shield structures may provide a shield signal to the environmental enclosure surrounding much of the perimeter of the probing environment. The environmental enclosure may typically be connected to shield, earth ground, instrumentation ground, or some other desired potential.

To provide test, guard, and shield signals to the probe station, existing probe stations often include a multistage chuck upon which the electrical device rests while being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multi-stage chuck may be both guarded and shielded from below. Similarly, single stage and dual stage chucks, and chucks with substantial openings centrally defined therein are likewise frequently employed.

Further reduction in interference can be obtained by locating a suspended conductive plate over the electrical device which is typically electrically insulated from the test signal path and connected to the guard signal. The suspended plate defines a central opening so that the probe assembly may make electrical contact with the electrical device. In this fashion, the electrical device can be guarded from both below and above by signals closely approximating that delivered to the electrical device.

Though such a probe station is effective in performing low-current testing and high frequency testing of electrical devices, the aforementioned existing probe stations unfortunately often exhibit significant inductance to high current measurements, and particularly when testing using pulsed signals. The high inductance tends to resist fast changes in the current levels, and results in higher than desirable voltage and current levels.

What is desired, therefore, is a probe station that is suitable for performing high current and/or pulsed tests.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

Figure 1:
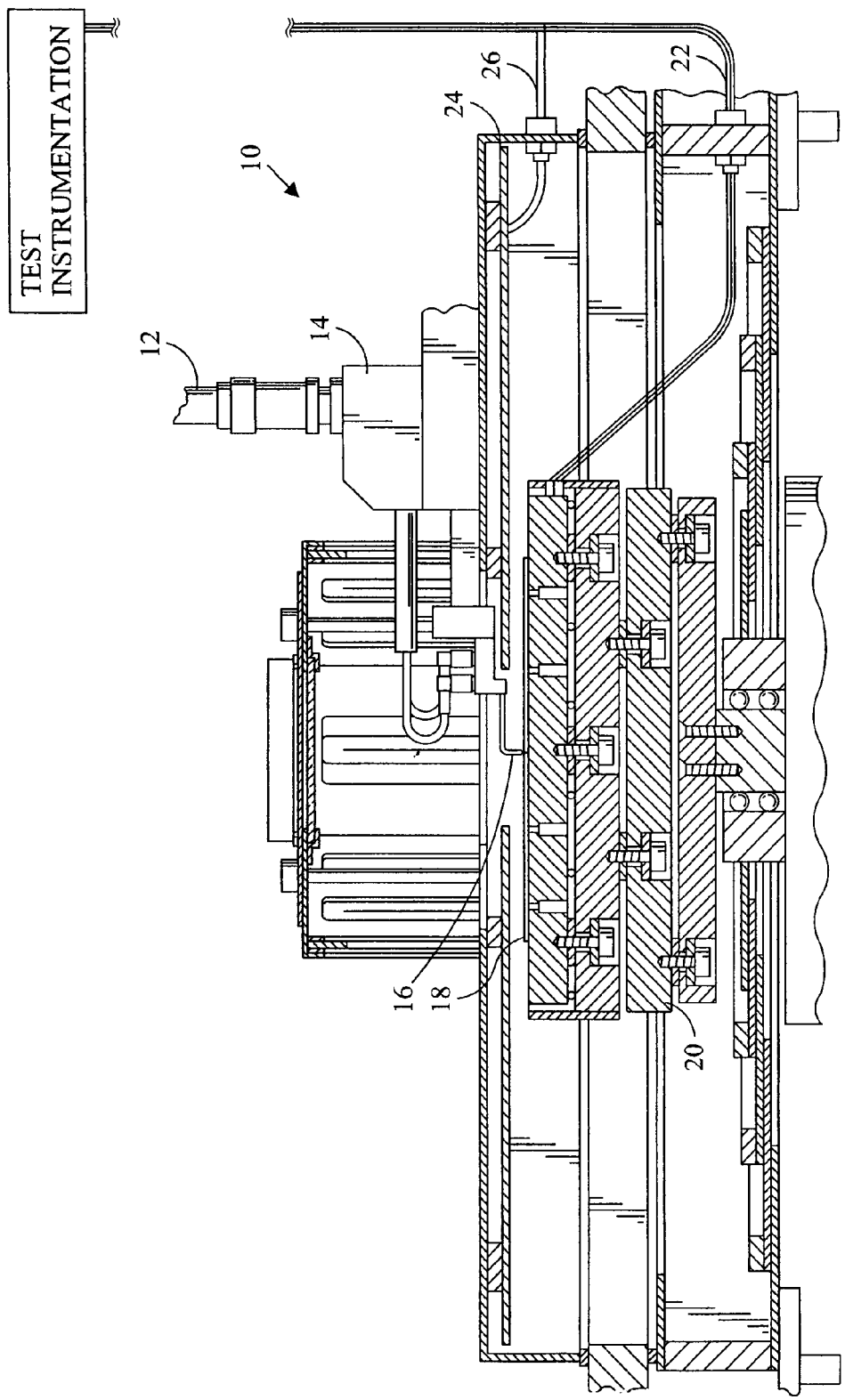
FIG. 1 shows a schematic of an existing probe station having guard and electromagnetic shield structures.

FIG. 1 shows a general schematic diagram of an existing probe station 10 having guard and electromagnetic shield structures. A test signal is provided through a test path 12 to a probe 14 having probe needles 16 that contact an electrical device 18 resting upon a chuck 20. The probe needles may alternatively be any type of contacts, such as for example, probe cards, probes on movable positioners, optical signals, and membrane probes. The chuck 20 receives a guard signal through a first transmission line 22 while a suspended guard member 24 receives a guard signal through a second transmission line 26. The first transmission line 22 likewise includes a test signal path to the chuck 20. The first transmission line 22, the test path 12, the probe 14, the needles 16, the device 18, and the chuck 20 together form a large loop, as shown in FIG. 1, to a common signal source at the test instrumentation. Normally within the probe station the transmission line 22 is within a service loop that is several feet long to accommodate movement of the chuck 20.

Figure 2:
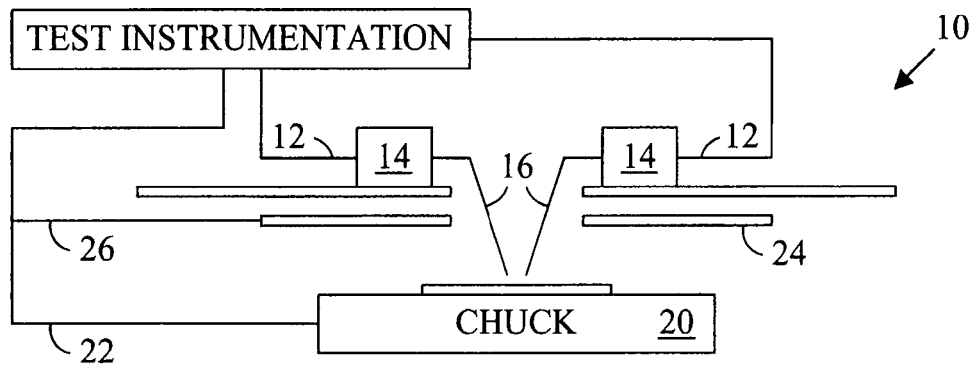
FIG. 2 illustrates a general schematic of FIG. 1.

The present inventors came to the realization that when using high current or pulsed tests, the large test loop that originates from the test equipment and passes through the chuck creates undesirable inductance. The inductance resulting from this large loop often interferes with test measurements, and in particular high current and/or pulsed signals. In addition, the transmission line 22 is normally a small conductor which is not especially suitable for carrying high currents. FIG. 2 illustrates more schematically the resulting test loop for purposes of clarity.

Figure 3:
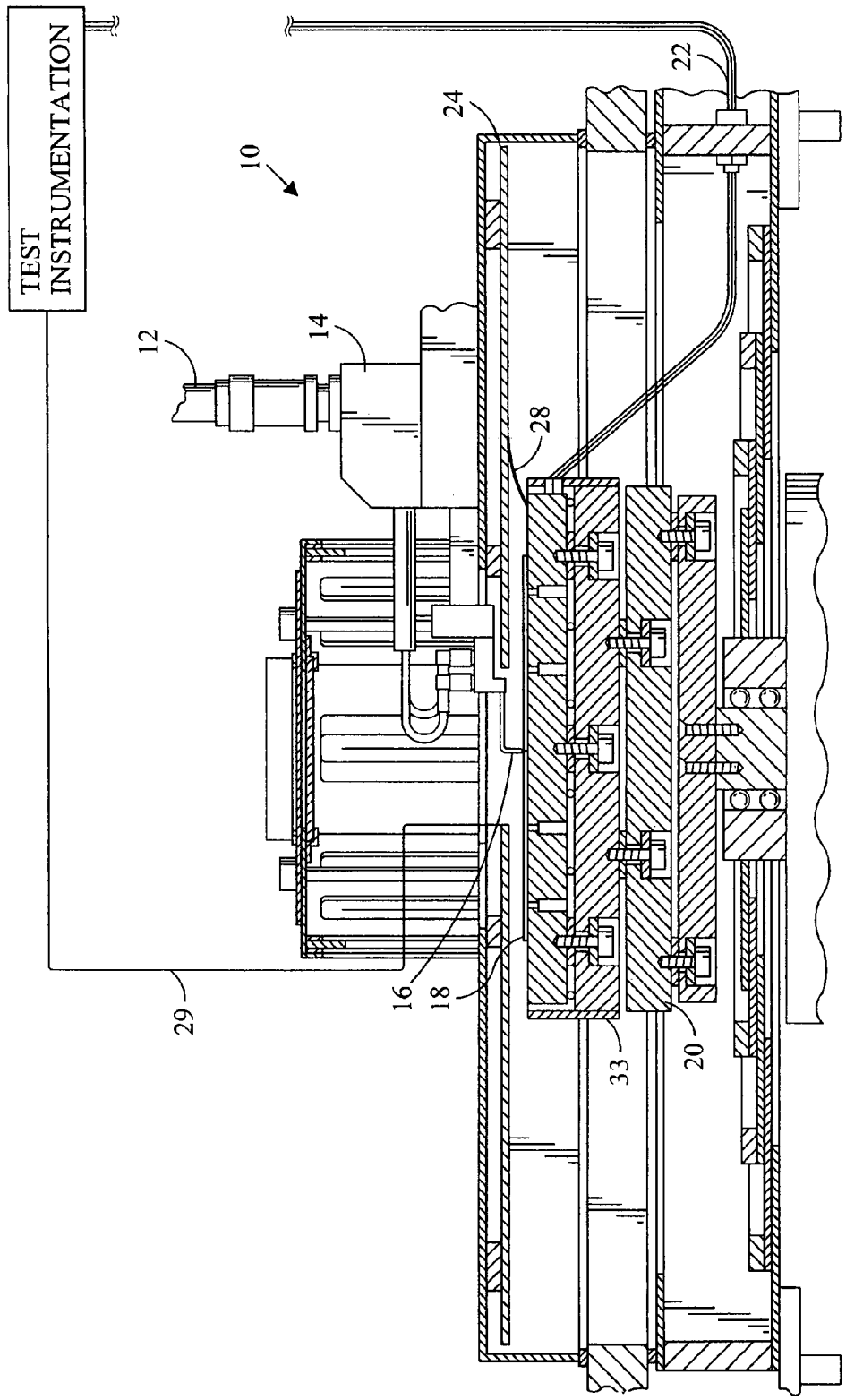
FIG. 3 shows schematic of a modified probe station exhibiting reduced inductance.

The present inventors further determined that reducing or otherwise modifying this previously unrecognized source of inductance for high current and/or pulsed signals, namely, the inductive test loop could improve such measurements. The modification may include modifying or otherwise providing another test signal path from the chuck 20 to the test instrumentation. FIG. 3 shows one embodiment of a probe station 10 with a test loop having a decreased length. Rather than routing the test signal from the chuck 20 through transmission line 22, a transmission line 28 may interconnect the chuck 20 with the suspended guard member 24, which is then electrically connected to the test instrumentation by another transmission line 29. The suspended guard member 24 typically has its guard potential removed when performing this test. Accordingly, the suspended guard member 24 is being used in a non-traditional manner, namely, not interconnected to a guard potential. The interconnection of the transmission line 28 at the chuck 20 may be one of the layers of the chuck 20 such as the top layer of the chuck 20. The at least partially encircling conductive member 33, normally connected to guard potential, may have a height greater than the top surface of the chuck, even with the top surface of the chuck, or below the top surface of the chuck. Preferably, there is an air gap between the conductive member 33 and the chuck 20. The air gap may be partially filled, substantially filled, or completely filled with dielectric material. The signal path to or from the top surface of the chuck may be provided through an opening in the conductive member 33. Electrically connecting the chuck 20 to the suspended guard member 24 by the transmission line 28, and to the test instrumentation by transmission line 29, results in a smaller loop path than that provided by previously existing probe stations, as shown schematically in FIG. 4. By reducing the length of the test path loop, electrical performance is improved, particularly when testing an electrical device using high-current and/or pulsed signals.

It is to be understood that the suspended plate may be suspended from above, typically using insulators, or supported by supports from within the probe station, or supported by the chuck or chuck assembly. Normally the suspended plate does not move together with the chuck 20, but is rather maintained in a fixed spatial relationship with respect to the probe station 10. Also, it is to be understood that the suspended plate may be any conductive member within the probe station that has the characteristic that it does not move together with the chuck 20, but is rather maintained in a fixed spatial relationship with respect to the probe station 10. Alternatively, the suspended member may be any conductive member within the probe station that is free from being electrically connected to a guard and/or shield potential when used in the aforementioned configuration.

The interconnections from the chuck 20 to the suspended guard 24 is preferably totally within the environmental enclosure. A further explanation of the environmental enclosure is disclosed in U.S. Pat. No. 5,457,398, incorporated by reference herein. Interconnection within the environmental enclosure potentially reduces the length of the conductive path to less than it would have been had the interconnection been, at least in part, exterior to the environmental enclosure, or otherwise the test path passing from within the environmental enclosure to outside the environmental enclosure to within the environmental enclosure.

Figure 4:
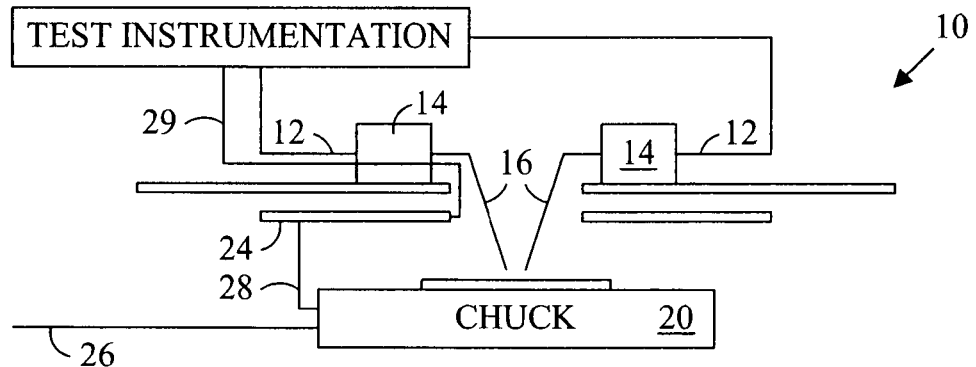
FIG. 4 illustrates a general schematic of FIG. 3.
Figure 5:
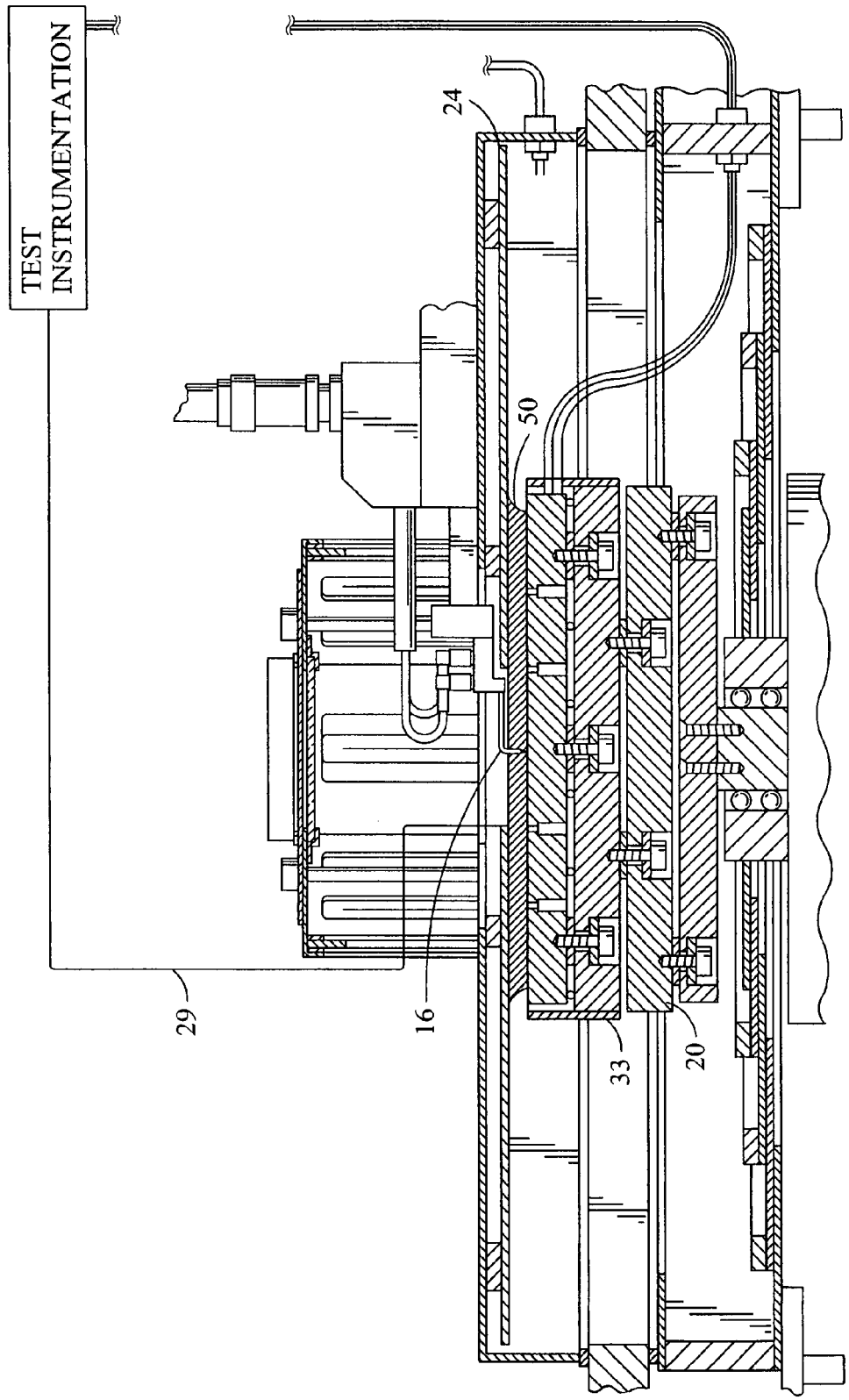
FIG. 5 shows schematic of another modified probe station exhibiting reduced inductance.

The transmission lines 28 and 29, shown schematically in FIGS. 2-4 may be embodied in many different structures. For example, the transmission lines 28 and 29 may be a traditional transmission line, such as a wire, coaxial cable, triaxial cable, and one or more conductive tabs. Alternatively, as depicted in FIG. 5, the transmission line 28 may comprise a conductive shell or bowl 50 that contacts the test path of the chuck 20 (e.g., top layer) at its lower end and the suspended plate 24 at its upper end. The shell 50 preferably encircles a major portion of the chuck 20 and more preferably substantially all of the chuck 20. In addition, the shell 50 while preferably forming a substantially closed loop may have a size less than, at least in part, the exterior periphery defined by the chuck 20. Also, preferably the conductive shell 50 includes a flexible upper portion in contact with the suspended member so that upon pressing engagement a good conductive interconnection is made even while the conductive shell 50 moves horizontally relative to the suspended plate 24. Moreover, the shell 50 may be detachably engageable with the suspended member by changing its height, such as for example, using "flip-up" fingers. In addition, a flexible upper portion also permits a greater range of movement of the chuck in the z-axis direction. In addition, the shell may be solid, flexible, and/or perforated with openings as desired. The openings, in particular, may be useful for permitting air flow around the device under test.

Figure 6:
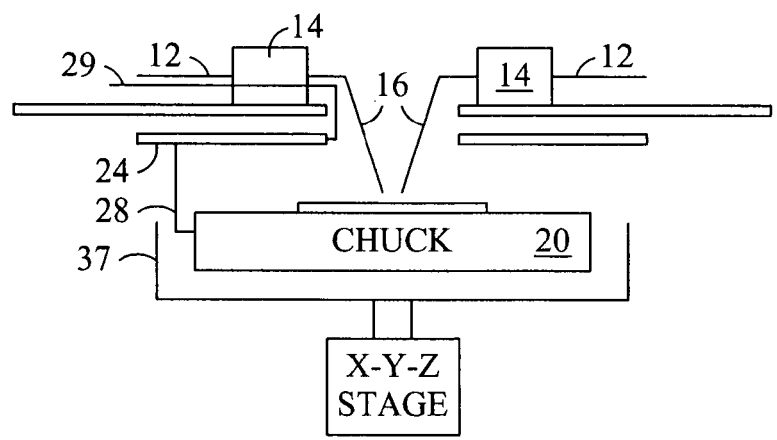
FIG. 6 shows schematic of yet another modified probe station exhibiting reduced inductance.

Referring to FIG. 6, the reduced inductance test path may be included within the structure that includes an enclosure 37 that surrounds the chuck therein. During testing of the device under test the enclosure 37 moves together with the chuck 20. The interconnection 28 to the suspended member may be by a cable or otherwise from a location within the chamber or otherwise connected to the chuck therein.

Figure 7:
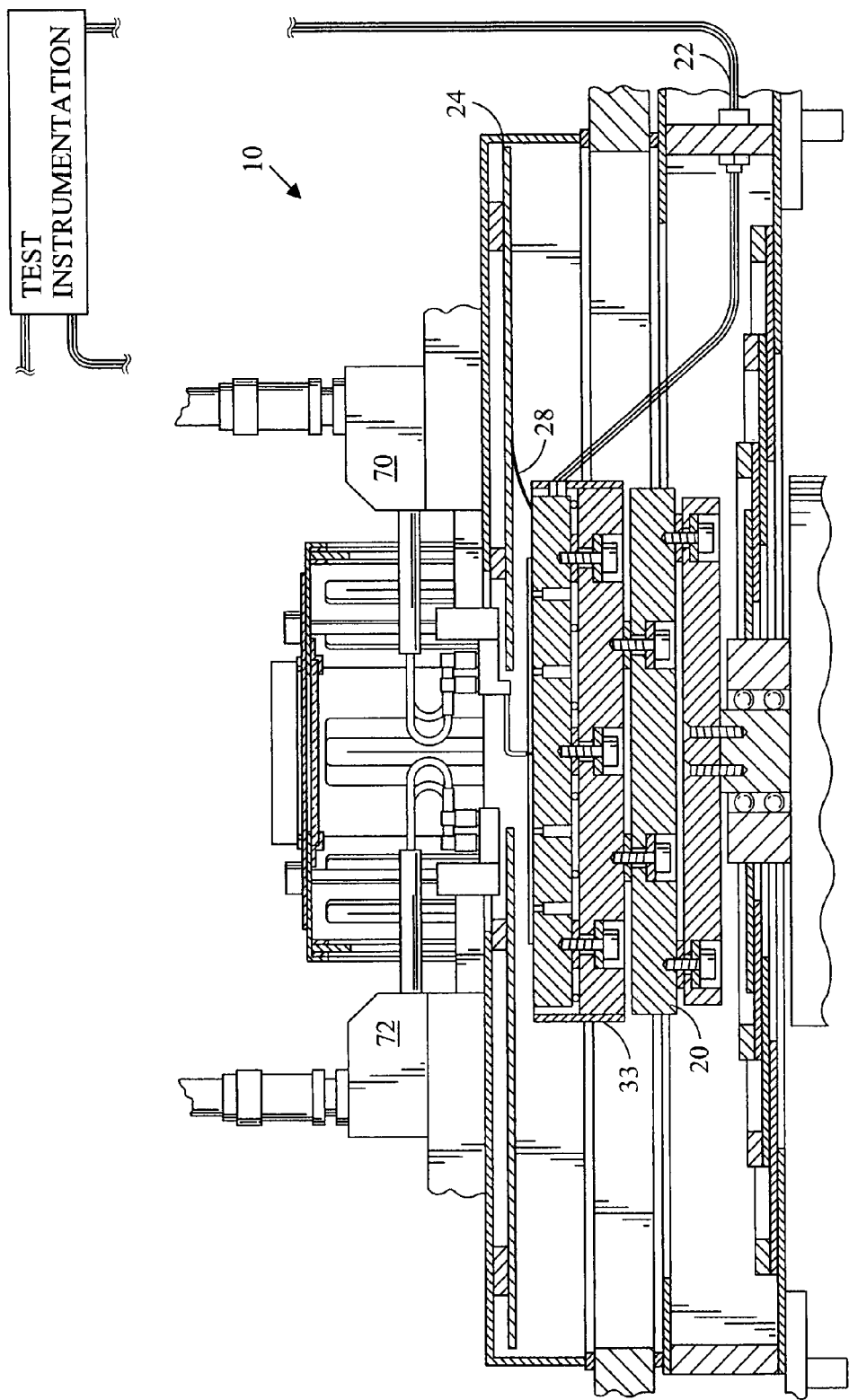
FIG. 7 shows schematic of a further modified probe station exhibiting reduced inductance.

Referring to FIG. 7, a dual probe assembly may be used to provide a test signal path. A first probe 70 may provide a test signal to the device under test. The test signal then passes through the device under test and to the chuck 20. The chuck 20 is electrically interconnected to the suspended plate 24. A second probe 72 may receive the test signal from the suspended plate 24. Alternatively, the second probe 72 may be directly interconnected to the chuck 20 to receive the test signal.

Figure 8:
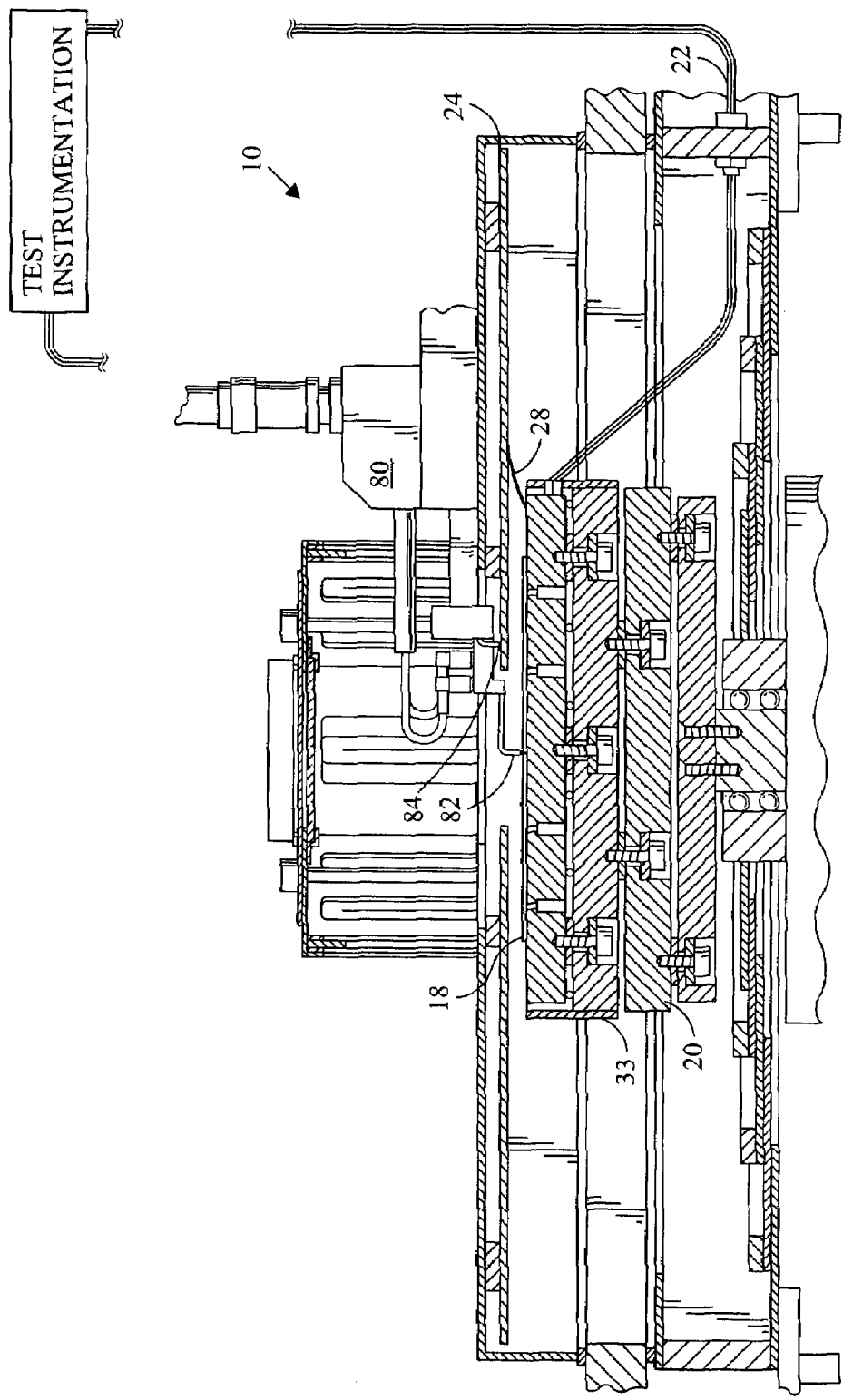
FIG. 8 shows schematic of a modified probe station exhibiting reduced inductance.

Referring to FIG. 8, a single probe assembly 80 may be used to provide and sense a test signal path. The probe 80 may provide a test signal to the device under test through a first probe tip 82. The test signal then passes through the device under test and to the chuck 20. The chuck 20 is electrically interconnected to the suspended plate 24. The single probe assembly 80 may receive the test signal from the suspended plate 24 through a second probe tip 84. Alternatively, the second tip of the probe assembly 80 may be direct interconnection to the chuck 20 to receive the test signal. In this manner a single probe assembly may both provide the test signal and sense the test signal. Also, it is preferred that the interconnected from the probe assembly 80 to the test instrumentation is a single cable assembly, more preferably a twisted pair of wires, to minimize inductance. The twisted pair of wires preferably extends at least 50% of the distance between the probe and the test instrumentation.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe assembly for probing an electrical device, said probe assembly comprising:

(a) a chuck having a first conductive member suitable for supporting an electrical device; and
(b) a second conductive member spaced apart from said chuck, wherein said electrical device is spaced between said first conductive member and said second conductive member, wherein said first conductive member is electrically interconnected to said second conductive member, wherein said first conductive member and said second conductive member are electrically connected to the same potential.

2. The probe assembly of claim 1 wherein said second conductive member is electrically interconnected to a test signal of said electrical device.

3. The probe assembly of claim 1 wherein said first conductive member comprises a first plate, said second conductive member comprises a second plate, and wherein said second conductive member is spaced further distant from said electrical device than said first conductive member.

4. The probe assembly of claim 1 wherein said second conductive member comprises a second plate and is vertically spaced apart from said first conductive member.

5. The probe assembly of claim 1 wherein said second conductive member is electrically interconnected to said first conductive member completely within an environmental chamber.

6. The probe assembly of claim 1 wherein said second conductive member is free from being supported by said chuck.

7. The probe assembly of claim 1 wherein said first conductive member is electrically interconnected to a first probe, wherein said second conductive member is electrically interconnected to a second probe.

8. The probe assembly of claim 1 wherein said first conductive member and said second conductive member are electrically interconnected to a first probe.

9. The probe assembly of claim 1 wherein said first probe is electrically interconnected to test instrumentation using a twisted pair of wires over at least 50% of the distance between said first probe and said test instrumentation.

10. The probe assembly of claim 1 further comprising a detachable substantially closed loop member engageable with said first conductive member and said second conductive member, where said loop member includes a flexible member interconnecting said first conductive member and said second conductive member.

\* \* \* \* \*